(12) United States Patent
Toh et al.

(10) Patent No.: US 8,772,921 B2
(45) Date of Patent: *Jul. 8, 2014

(54) INTERPOSER FOR SEMICONDUCTOR PACKAGE

(75) Inventors: Chin Hock Toh, Singapore (SG); Yao Huang Huang, Singapore (SG); Ravi Kanth Kolan, Singapore (SG); Wei Liang Yuan, Singapore (SG); Susanto Tanary, Singapore (SG); Yi Sheng Anthony Sun, Singapore (SG)

(73) Assignee: United Test and Assembly Center Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/347,683

(22) Filed: Jan. 10, 2012

(65) Prior Publication Data

US 2012/0104628 A1 May 3, 2012

Related U.S. Application Data

(62) Division of application No. 12/604,613, filed on Oct. 23, 2009, now Pat. No. 8,115,292.

(60) Provisional application No. 61/107,677, filed on Oct. 23, 2008.

(51) Int. Cl.
*H01L 23/02* (2006.01)

(52) U.S. Cl.
USPC .............................. 257/686; 257/698; 257/777

(58) Field of Classification Search
USPC .................. 257/686, 698, 777, 778, 723, 724
See application file for complete search history.

(56) References Cited

U.S. PATENT DOCUMENTS

| | | | |
|---|---|---|---|
| 3,577,037 A * | 5/1971 | Di Pietro et al. | 257/621 |
| 4,074,342 A * | 2/1978 | Honn et al. | 361/779 |
| 4,322,778 A * | 3/1982 | Barbour et al. | 361/794 |
| 5,229,647 A | 7/1993 | Gnadinger | |
| 5,404,044 A * | 4/1995 | Booth et al. | 257/698 |
| 7,230,330 B2 * | 6/2007 | Lee et al. | 257/686 |
| 2006/0022328 A1 * | 2/2006 | Lee | 257/698 |
| 2009/0115050 A1 * | 5/2009 | Kasuya et al. | 257/701 |
| 2009/0121346 A1 * | 5/2009 | Wachtler | 257/724 |
| 2009/0305502 A1 * | 12/2009 | Lee et al. | 438/667 |

* cited by examiner

*Primary Examiner* — S. V. Clark
(74) *Attorney, Agent, or Firm* — Horizon IP Pte. Ltd.

(57) ABSTRACT

An interposer is presented. The interposer includes an interposer base having first and second surfaces. A redistribution layer is disposed on a first surface of the interposer base. The interposer has at least one interposer pad coupled to the redistribution layer. It also includes at least one interposer contact on the second surface. The interposer contact is electrically coupled to the interposer pad via the redistribution layer. The interposer also includes at least one interposer via through the interposer base for coupling the interposer contact to the redistribution layer. The interposer via includes reflowed conductive material of the interposer contact.

20 Claims, 16 Drawing Sheets

400

400

INTERPOSER FOR SEMICONDUCTOR PACKAGE

CROSS-REFERENCE TO RELATED APPLICATIONS

This application is a divisional application of U.S. patent application Ser. No. 12/604,613, filed on Oct. 23, 2009, which claims benefit of U.S. Provisional Application No. 61/107,677 entitled "Interposer For Semiconductor Package" filed on Oct. 23, 2008. All disclosures are herein incorporated by reference in their entirety.

BACKGROUND

Flip chips are widely used in the semiconductor industry. A flip chip semiconductor package includes a flip chip mounted onto a package substrate, such as an organic substrate, through its solder bumps. The solder bumps are electrically connected to respective contact pads on the package substrate.

The coefficients of thermal expansion (CTE) of the flip chip and package substrate are mismatched. Mismatched CTE causes mechanical stress on the different components of the package as it experiences temperature excursions from thermal cycling or operation of the chip. This can negatively impact package reliability.

Also, with the strive towards higher performance of semiconductor packages, Input/Output (I/O) pads of flip chips are moving towards smaller pitches. As there is a limitation to the pitch of the contact pads of the package substrate, which couple to the respective I/O pads of the flip chip via the solder bumps, it has become a challenge to directly mount the flip chip onto the package substrate.

From the foregoing discussion, there is a desire to provide an improved package.

SUMMARY

An interposer is presented. The interposer includes an interposer base having first and second surfaces. A redistribution layer is disposed on a first surface of the interposer base. The interposer has at least one interposer pad coupled to the redistribution layer. It also includes at least one interposer contact on the second surface. The interposer contact is electrically coupled to the interposer pad via the redistribution layer. The interposer also includes at least one interposer via through the interposer base for coupling the interposer contact to the redistribution layer. The interposer via includes reflowed conductive material of the interposer contact.

In another embodiment, a device package is disclosed. The advice package includes an interposer base having first and second surfaces. A redistribution layer is disposed on a first surface of the interposer base. The device package includes interposer pads coupled to the redistribution layer. It also includes interposer contacts on the second surface. The interposer contacts are electrically coupled to the interposer pads via the redistribution layer. The device package also includes vias through the interposer base for coupling the interposer contacts to the redistribution layer. The interposer vias include reflowed conductive material of the interposer contact. The device package also has a die including die contacts. The die contacts are coupled to the interposer pads. There is a package substrate having package pads on a first surface. The interposer contacts are coupled to the package pads.

In yet another embodiment, a method of forming an interposer is presented. The method includes providing an interposer base. It also includes forming a redistribution layer on a first surface of the interposer base. Interposer contact pads electrically coupled to the redistribution layer are formed. Interposer vias are also formed in the interposer base. The vias include a via opening on a second surface of the interposer base and extend to expose the redistribution layer. The method also includes providing a reflowable conductive material on the via opening. It also includes heating to cause the conductive material to reflow to fill the interposer vias and form interposer contacts.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor packages for chips or integrated circuits (ICs). Various types of chips or ICs can be packaged. For example, the IC can be a memory device such as a dynamic random access memory (DRAM), a static random access memory (SRAM) and various types of non-volatile memories including programmable read-only memories (PROM) and flash memories, an optoelectronic device, a logic device, a communication device, a digital signal processor (DSP), a microcontroller, a system-on-chip, as well as other types of devices. The ICs can be incorporated into various products, such as phones, computers, personal digital assistants or other types of suitable products.

Figure 1:
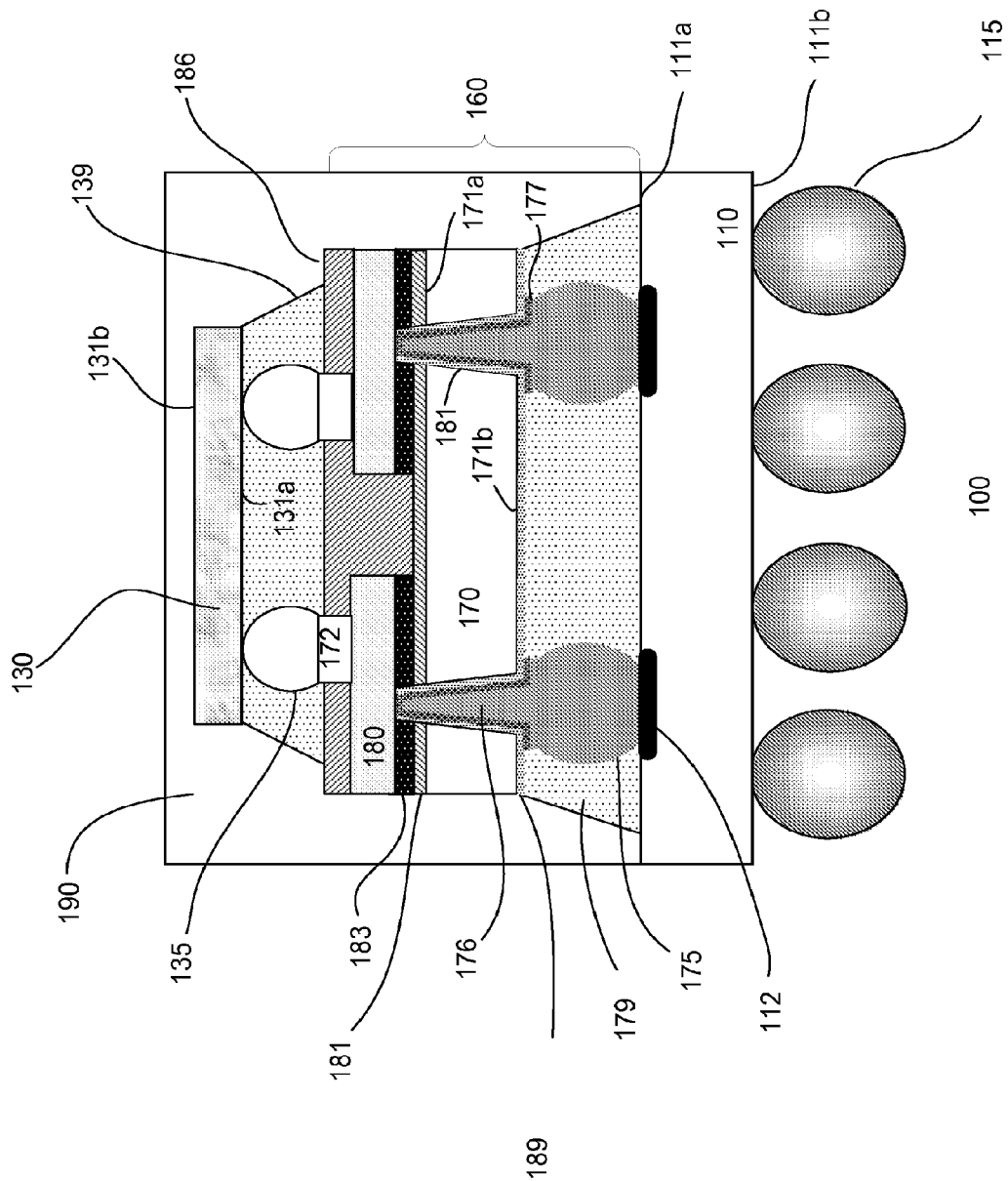
FIGS. 1-3 show various embodiments of a device package.
Figure 2:
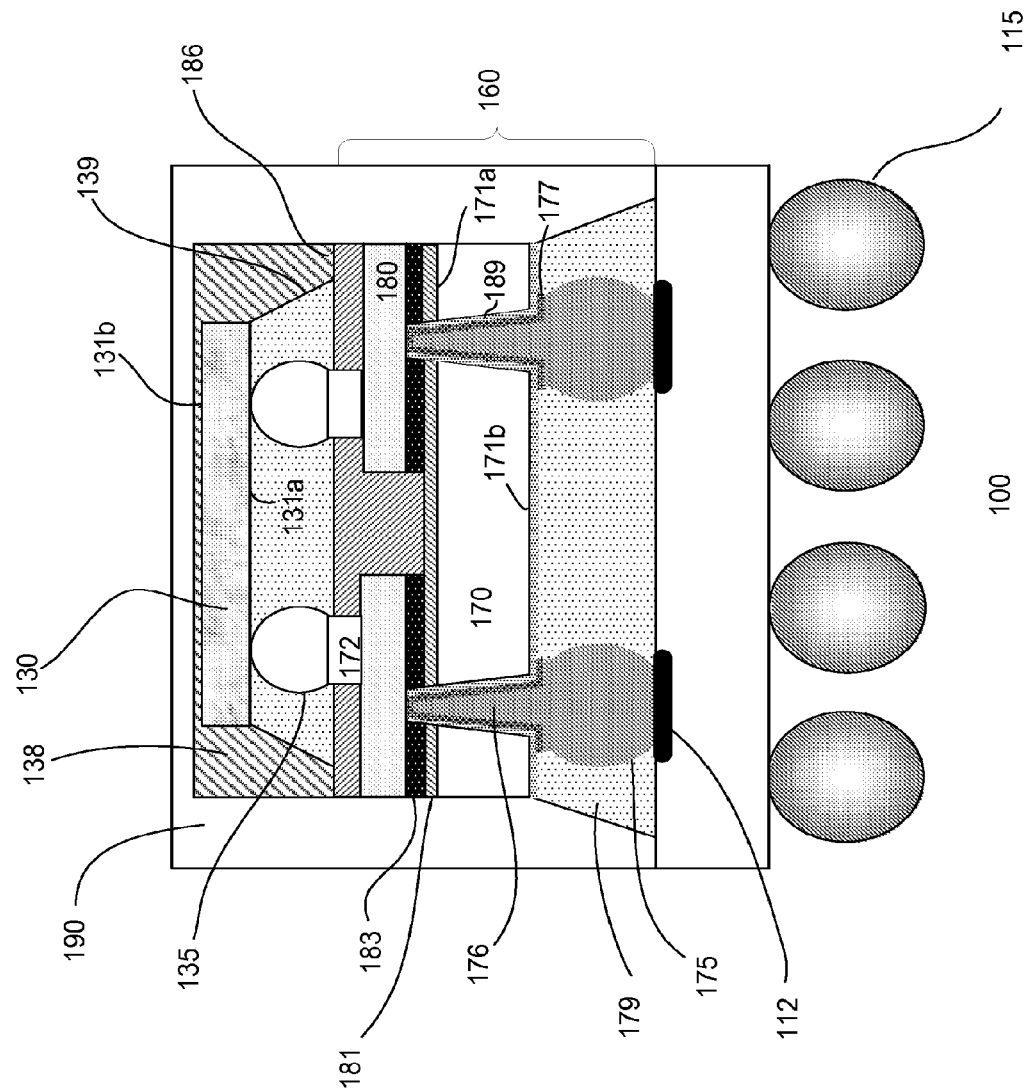
Figure 3:
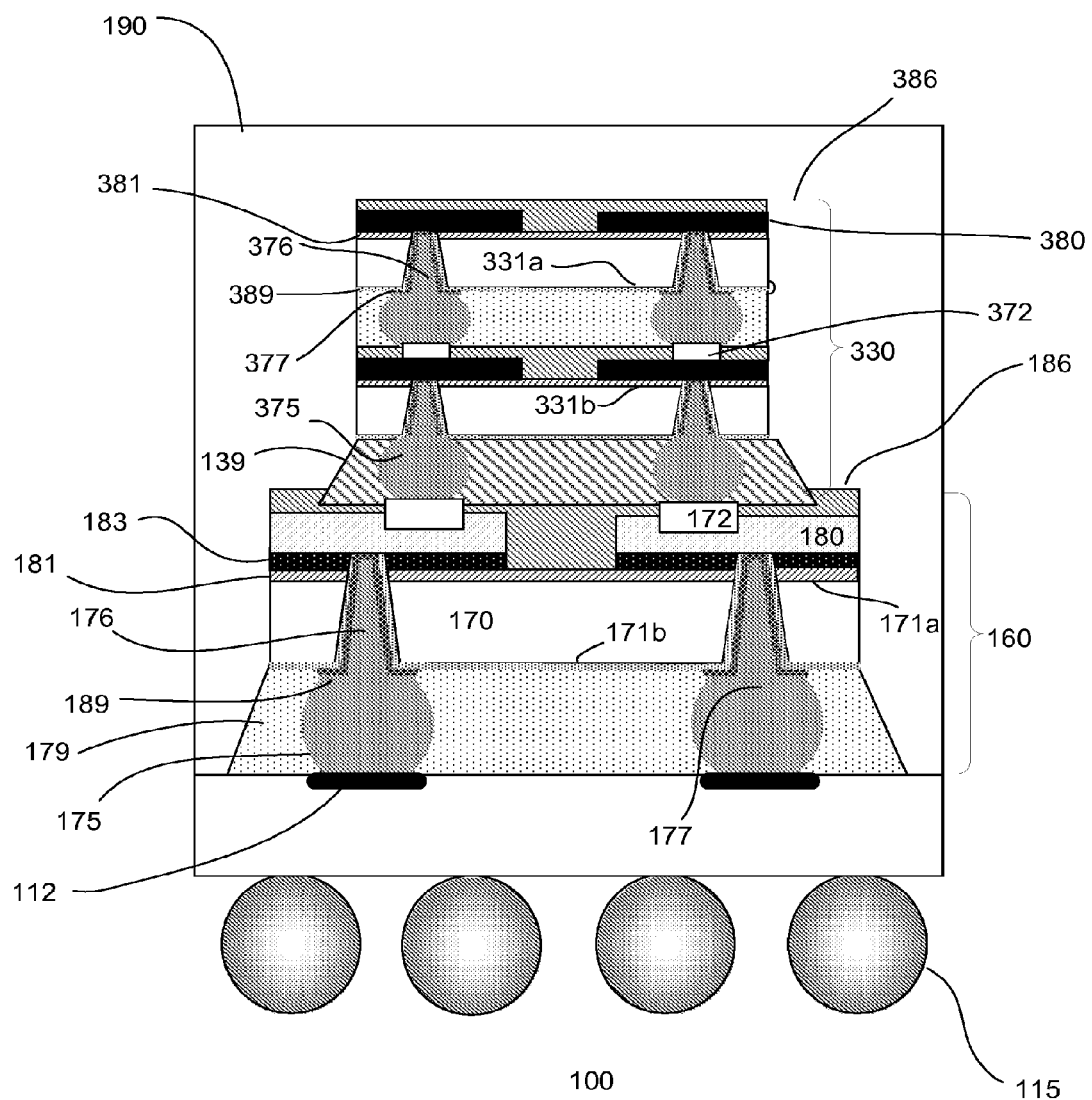

FIGS. 1-3 show various packages. Referring to FIG. 1, a package 100 includes a carrier or package substrate 110 with top and bottom major surfaces 111a-b. Typically, the substrate comprises a rectangular shape to form a rectangular shaped device. Other shapes are also useful. The substrate can be any type of substrate used for integrated circuit (IC) packages. For example, single or multi-layer substrates can be used. The different layers can be laminated or built-up. The package substrate can comprise various types of materials. For example, the package substrate comprises an organic material, such as Bismaleimide Triazine (BT) or polyimide. Other types of materials can also be employed for the package substrate.

As shown, package contacts 115 are provided on one of the major surfaces. The surface on which the contacts are located is, for example, referred to as the bottom surface 111b. The package contacts serve as external package connections. For example, the package contacts can be electrically coupled to an external device (not shown), such as a circuit board. The package contacts may comprise spherical shaped structures or balls arranged in a grid pattern to form a Ball Grid Array (BGA) type package. Other types of package contacts, such as solder lands, may be used. In one embodiment, the package contacts comprise a reflowable conductive material. Preferably, the package contacts comprise solder. Various types of solders can be used, such as lead-based, non lead-based alloys or conductive polymers. Bottom package pads (not shown) can be provided on the bottom surface 111b of the package substrate where the package contacts are disposed. The package contact mate with the bottom package pads when disposed thereon.

On the top surface of the substrate are disposed top package pads 112. The top package pads comprise a package pad pattern. The top package pads may be arranged in a manner that would correspond to the pattern of contacts of a device that is to be mounted thereon.

The top package pads, as shown, are disposed on a chip region on the top surface of the package substrate. The top package pads are coupled to the bottom package pads by, for example, vias (not shown). Electrical traces may be provided on the top to couple the top package pads to the vias. Likewise, electrical traces may be provided on the bottom surface to couple the bottom package pads to the vias.

A die 130 is electrically coupled to the package substrate. In one embodiment, the die comprises a flip chip. Other types of dies may also be useful. The die includes an active surface 131a and an inactive surface 131b. Die contacts 135 are provided on the active surface of the die. The die contacts enable internal circuitry of the die to be accessed. In one embodiment, the die contacts comprise solder bumps. Other type of die contacts may also be used. For example, the die contacts may comprise stub bumps formed from gold or other metals and alloys may be used.

The die contacts, for example, are disposed in a die contact pattern. The die contact pattern, for example, comprises die contacts arranged as single or multi-rows in the center and/or at the periphery of the active surface of the die. Other die contact patterns or arrangements may also be useful.

In accordance with one embodiment, an interposer 160 is provided. The interposer serves as a medium for coupling the die to the package substrate. In one embodiment, the interposer comprises an interposer base 170. Preferably, the base comprises a material having the same or similar CTE as the die. For example, the base comprises silicon. The silicon may be an inactive wafer or chip, or an active silicon wafer or chip. Other types of material may be used to form the base. Providing a base having at least a similar CTE as the die reduces mechanical stress caused by a difference in CTE between the die and the package substrate.

The interposer base comprises first and second surfaces 171a-b. The first surface, for example, serves as the top surface and the second surface serves as the bottom surface. The bottom surface comprises interposer contacts 175. The interposer contacts are arranged in an interposer contact pattern. The interposer contact pattern corresponds, for example, to the package pad pattern of the top package pads. The interposer contacts are electrically coupled to the package substrate via the top package pads.

In one embodiment, an insulating layer 181 is provided on the first surface 171a of the interposer base layer 170. The insulating layer may comprise silicon oxide, silicon dioxide, polymeric materials or other materials that can electrically insulate the base layer. An interposer redistribution layer 180 is provided on the insulating layer at the top surface of the interposer. In one embodiment, the redistribution layer comprises patterned conductive lines which are coupled to the interposer pads 172. Various conductive materials, such as copper, gold, aluminum, alloys thereof or other types of metal or alloys, can be used to form the conductive lines. A conductive seed layer 183 may be provided to facilitate forming the conductive lines of the redistribution layer. The seed layer may comprise copper, copper alloy or other types of conductive materials.

As for the interposer pads, they comprise a conductive material. For example, the interposer pads may be formed of copper, copper alloy, nickel or other types of metals or alloys. The interposer pads are arranged in an interposer pad pattern. The interposer pad pattern corresponds to the die contact pattern. The die is electrically coupled to the top surface of the interposer. For example, the die contacts on the active surface of the die are coupled to respective interposer pads.

A passivation layer 186 covers the redistribution layer and isolates the interposer pads. The passivation layer, for example, comprises a dielectric material. Various types of dielectric materials, such as silicon oxide, silicon nitride, polyimide or a combination thereof, may be used.

The interposer base comprises interposer vias 176 which interconnect the interposer contacts to the interposer pads via the redistribution layer. In one embodiment, the vias comprise the same material as the interposer contacts. Preferably, the vias are filled with reflowed material of the package contacts. For example, the vias are filled with solder and the package contacts are formed from solder.

In one embodiment, the sidewalls of the vias may be lined with a dielectric liner 189. The dielectric liner further lines the bottom surface 171b of the interposer base layer. The dielectric liner, for example, comprises silicon oxide, silicon nitride, polymeric materials or a combination thereof. Other types of dielectric materials may also be used to serve as the liner.

A metallic coating layer 177 maybe provided over the dielectric liner 181 of the via. The coating layer facilitates, for example, filling of the vias by the reflowed material of the interposer contacts. In one embodiment, the coating layer comprises titanium, titanium tungsten, titanium nitride, tantalum, copper, nickel, alloys thereof or combinations thereof.

An underfill 139 is disposed in the space between the die and interposer. An underfill 179 may be provided between the interposer and package substrate. The underfill material may comprise, for example, an epoxy-based polymeric material. The underfill material encapsulates and protects the conductive contacts or bumps.

The package may include a cap 190 which encapsulates the die, interposer and top of the package substrate. The cap, for example, comprises a mold compound. The cap provides protection against the environment. The mold compound may fill the space between the die and interposer and/or the interposer and the package substrate, in the absence of an underfill.

FIG. 2 shows another embodiment of a package 100. As shown, the package is similar to the package of FIG. 1 except that the die comprises a die cap 138 which encapsulates the die 130 and top surface of the interposer. The die cap, for example, comprises a mold compound.

FIG. 3 shows yet another embodiment of a package 100. As shown, the package is similar to the package of FIGS. 1-2 except that a die stack 330 having a plurality of dies is electrically coupled to the interposer 160. The dies forming the die stack may comprise interposers made from active silicon wafers or chips, dies with through silicon interconnects, flip chips or combinations thereof. To interconnect the dies, a die redistribution layer 380 coupled to die pads 372 is provided on an inactive surface 331b of the die. A seed layer (not shown) may be disposed beneath the die redistribution layer 380. To isolate the die redistribution layer from the die, a die dielectric layer 381 may be provided between the inactive surface of the die and die redistribution layer. It is understood that the die on the top of the die stack need not have a redistribution layer.

Die contacts 375 on an active surface 331*a* are coupled to the die pads by die vias 376 and the die redistribution layer. A die passivation layer 186 is provided over the die redistribution layer and isolates the die interposer pads.

In one embodiment, the inactive surface 331*b* of the die and sidewalls of the die vias are lined with a die dielectric liner 389. The bottom, sidewalls and periphery of the vias on the inactive die surface are coated with a metallic layer 377. The die contacts are formed from conductive material. Forming the die contacts, in one embodiment, also fills the die vias by reflowing conductive material, such as solder, used to form the die contacts.

The various packages, as described, include an interposer. The interposer can be an inactive interposer, as described in FIGS. 1-2. In other embodiments, the interposer can be an active interposer, such as a chip or die. In yet other embodiments, the package can include both active and inactive interposers, as described in FIG. 3. An interposer includes vias filled by reflowing materials of the interposer contacts. For example, the vias are filled by reflowing the solder contacts. This avoids the need for electroplating to fill the vias. Avoiding the use of electroplating to fill vias results in higher throughput as well as costs savings since electroplating is time consuming and expensive. Furthermore, simultaneous filling of vias and forming, for example, solder interconnects decreases the number of lithographic and masking steps. This may reduce the interposer mask tooling and unit fabrication cost. In additional, increased reliability may be achieved by integrally forming the vias and interconnects from a common material.

In addition, by employing an interposer, fan-out of finer pitched die contacts (e.g., I/O pads or bumps) of the flip chip can be achieved via the redistribution layer to accommodate the larger pitched package pads of the package substrate. As a result, the interposer can enable connection of a flip chip to a package substrate even when the pitch of the package pads of the package substrate is unable to meet the fine pitched die contacts.

Figure 4A:
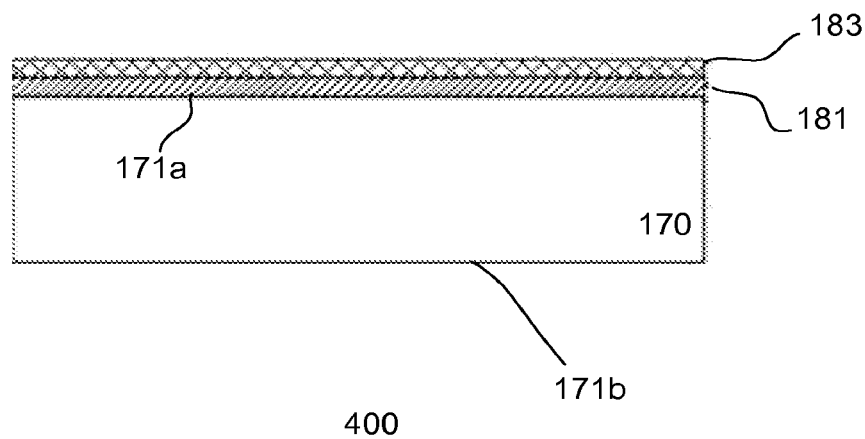
FIGS. 4a-p show an embodiment of a process for forming a package.
Figure 4B:
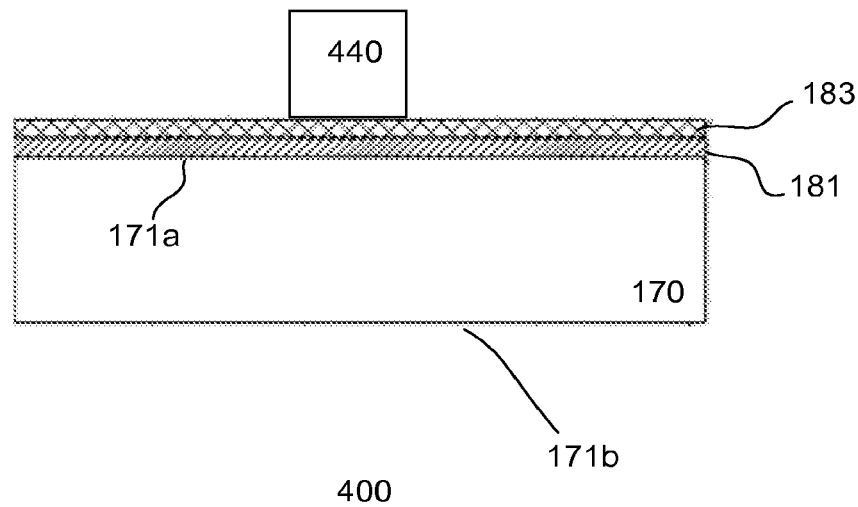
Figure 4C:
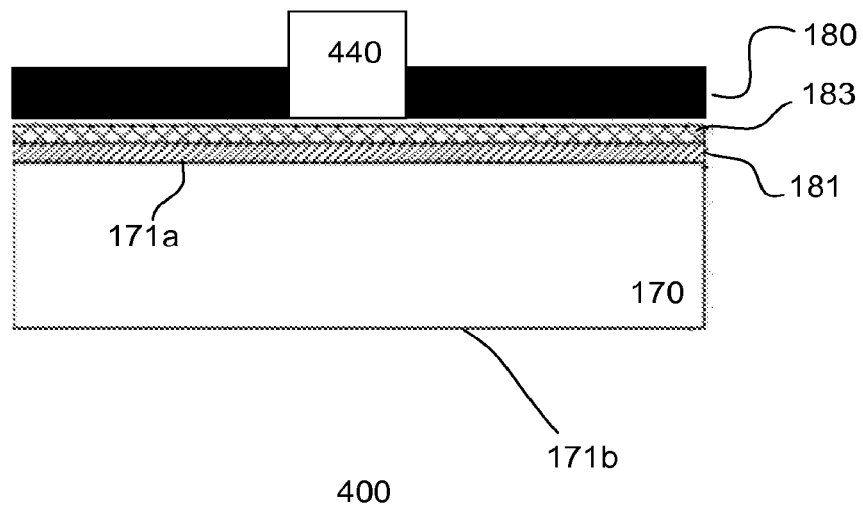
Figure 4D:
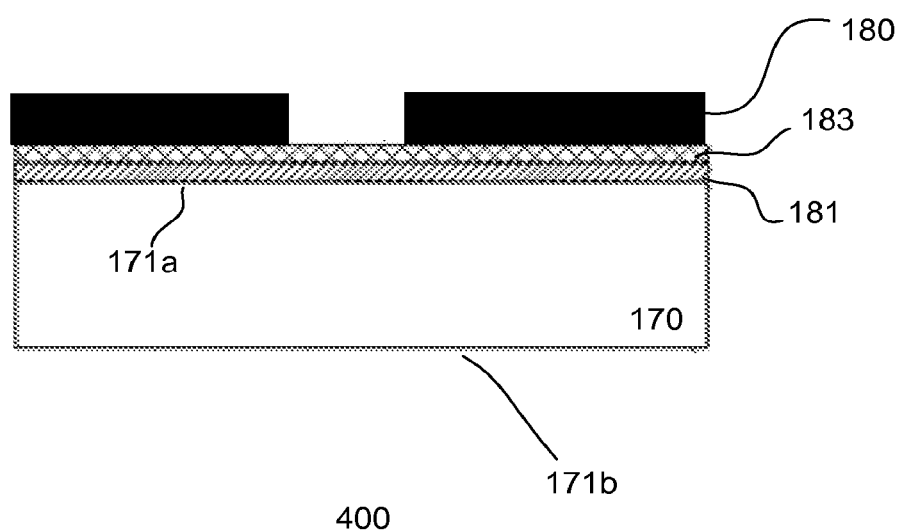
Figure 4E:
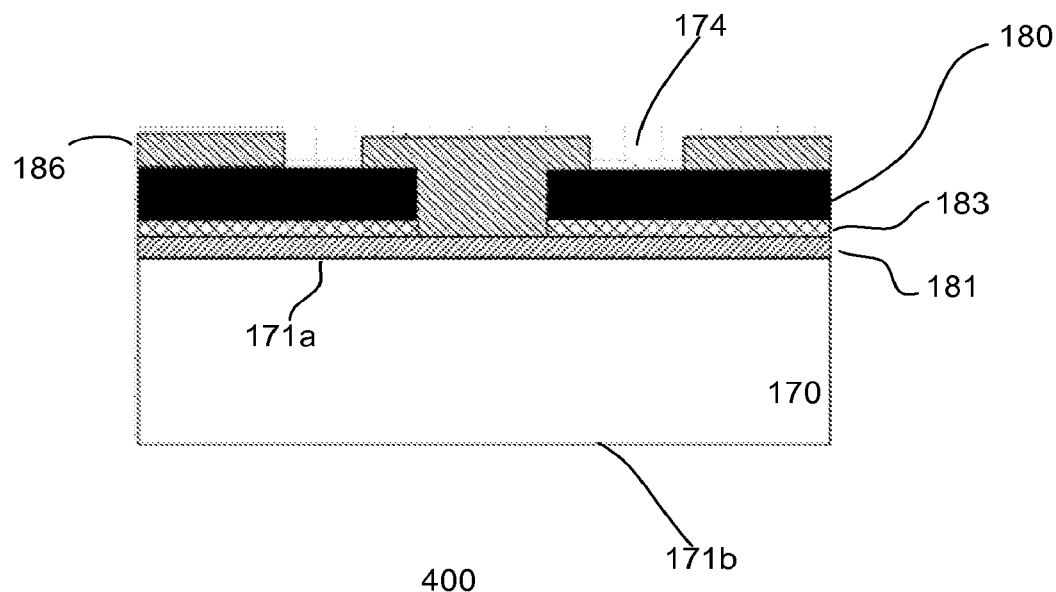
Figure 4F:
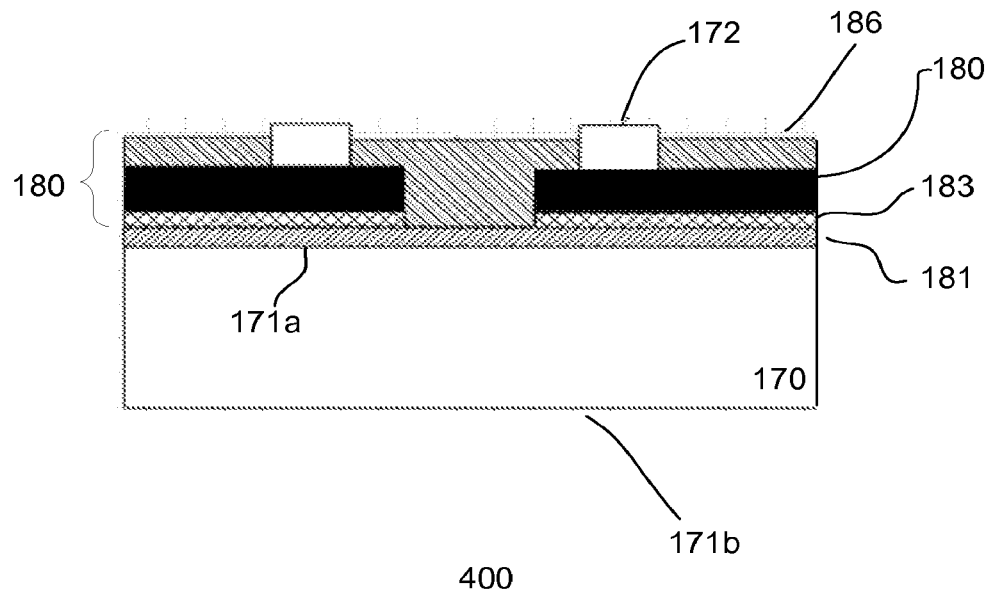
Figure 4G:
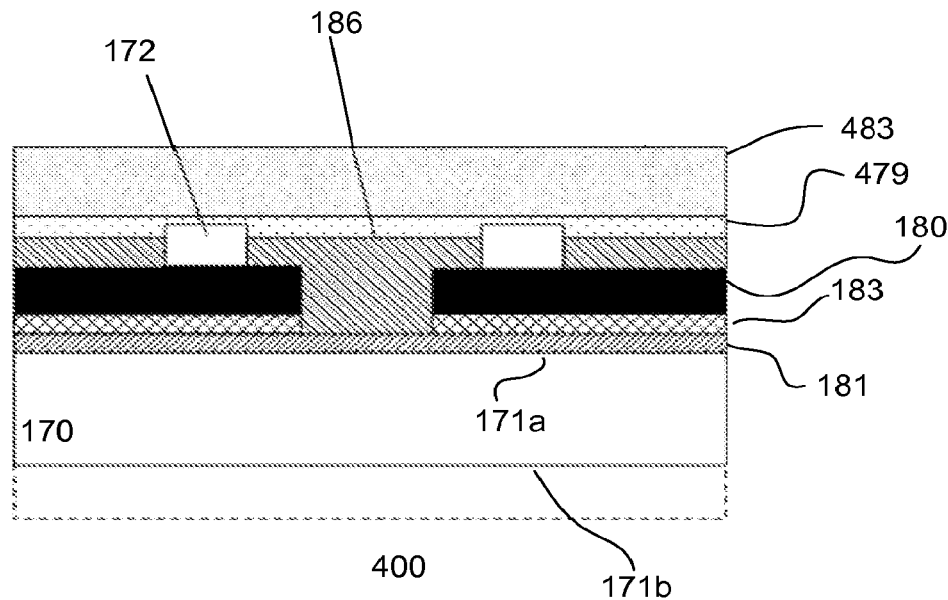
Figure 4H:
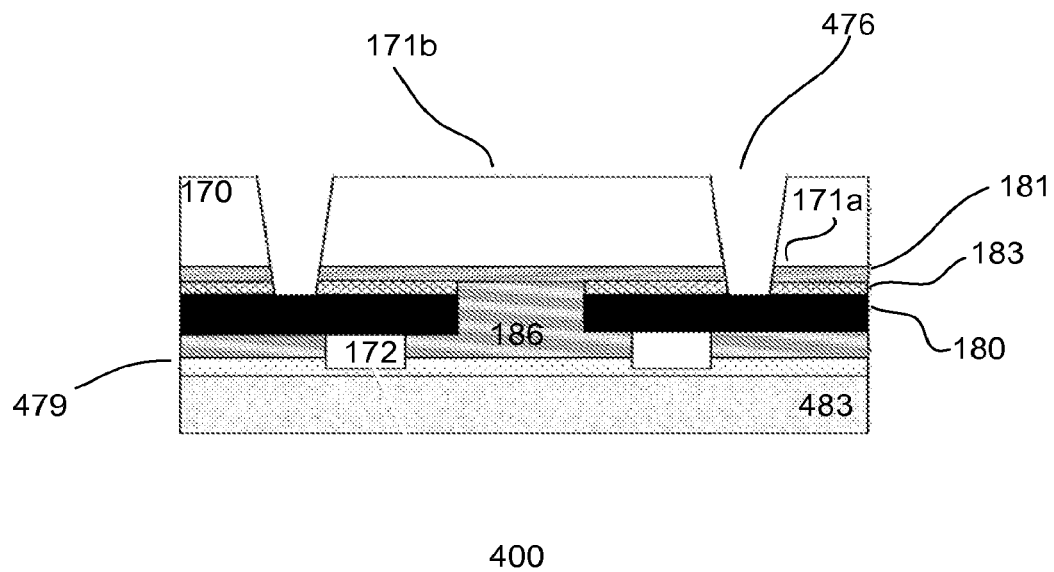
Figure 4I:
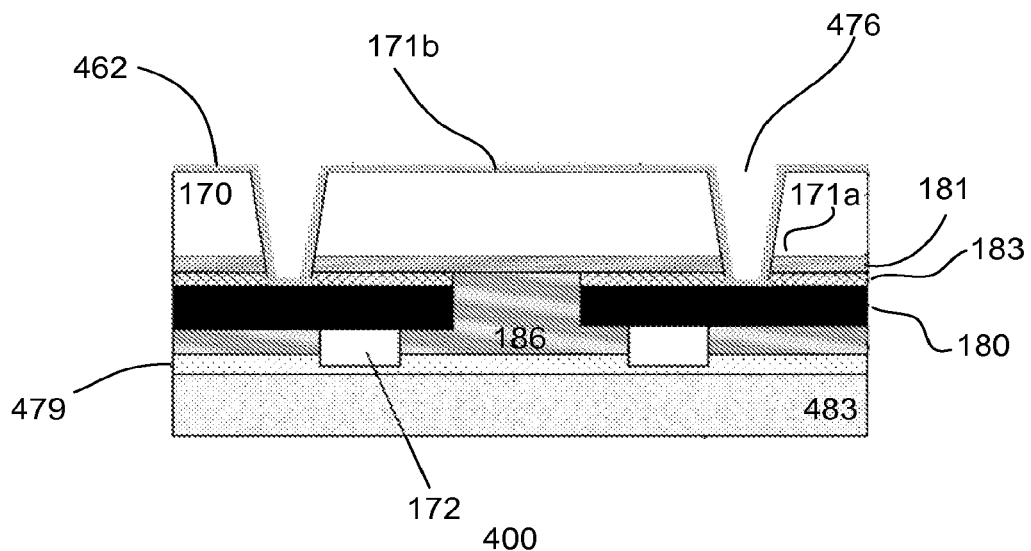
Figure 4J:
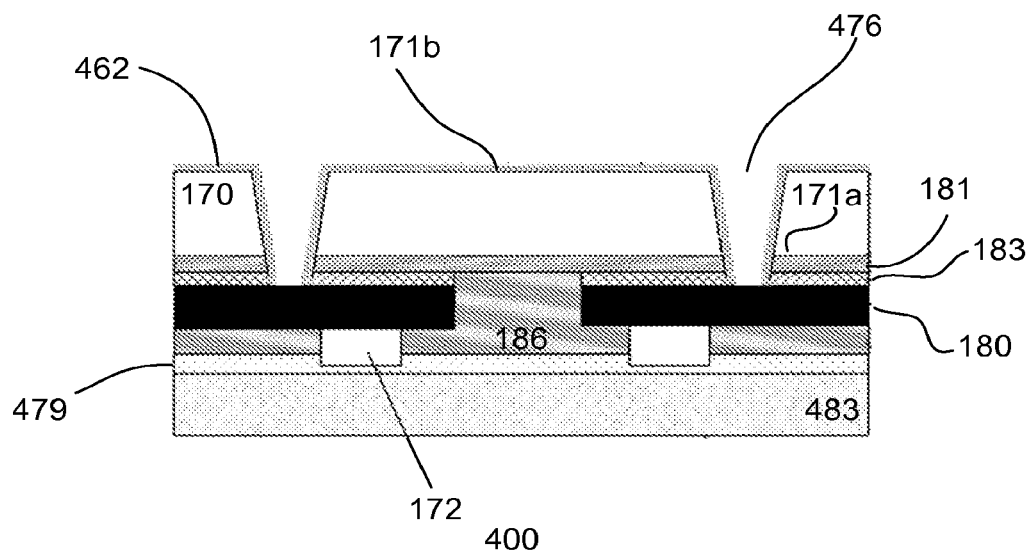
Figure 4K:
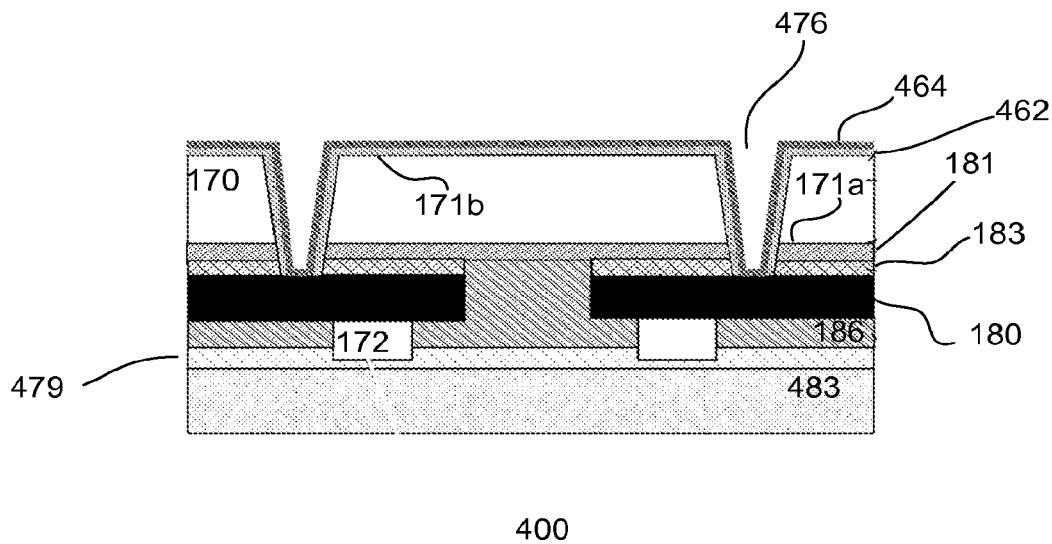
Figure 4L:
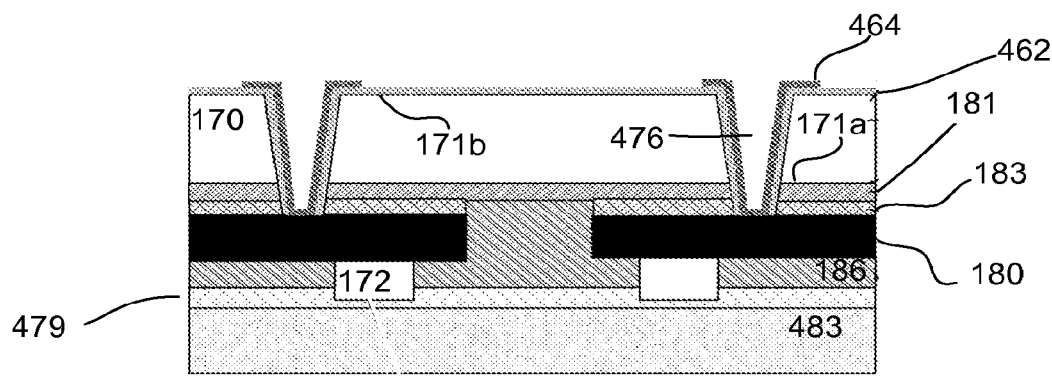
Figure 4M:
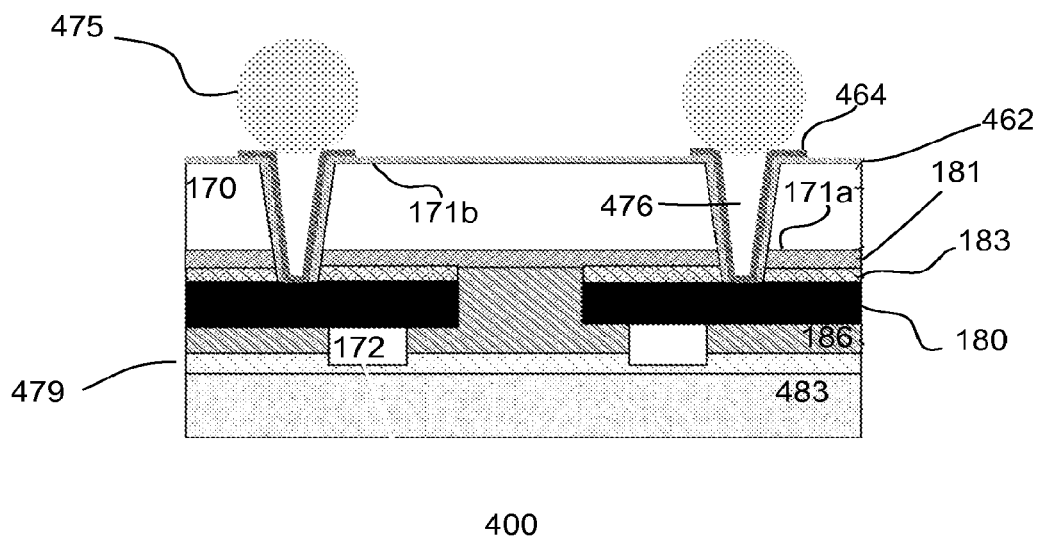
Figure 4N:
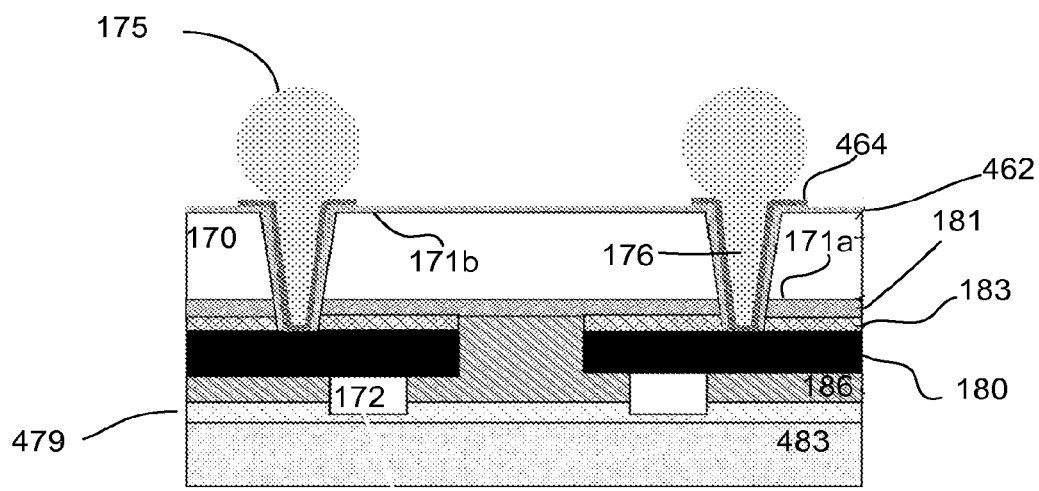
Figure 4O:
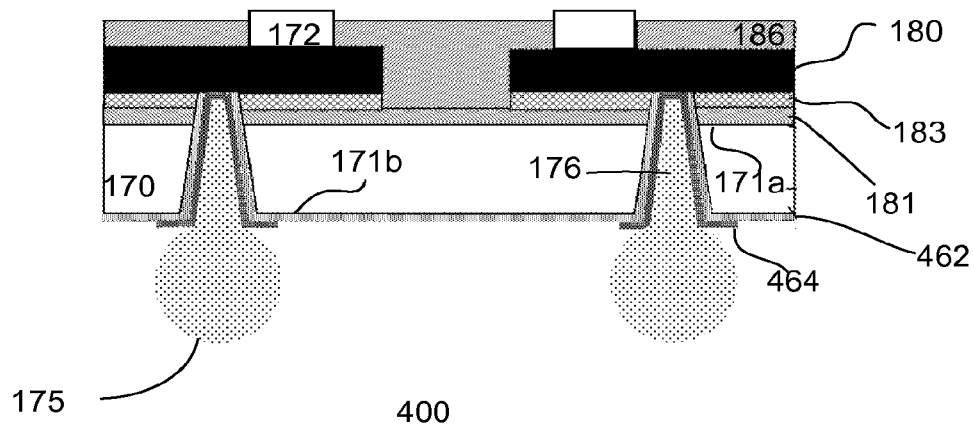
Figure 4P:
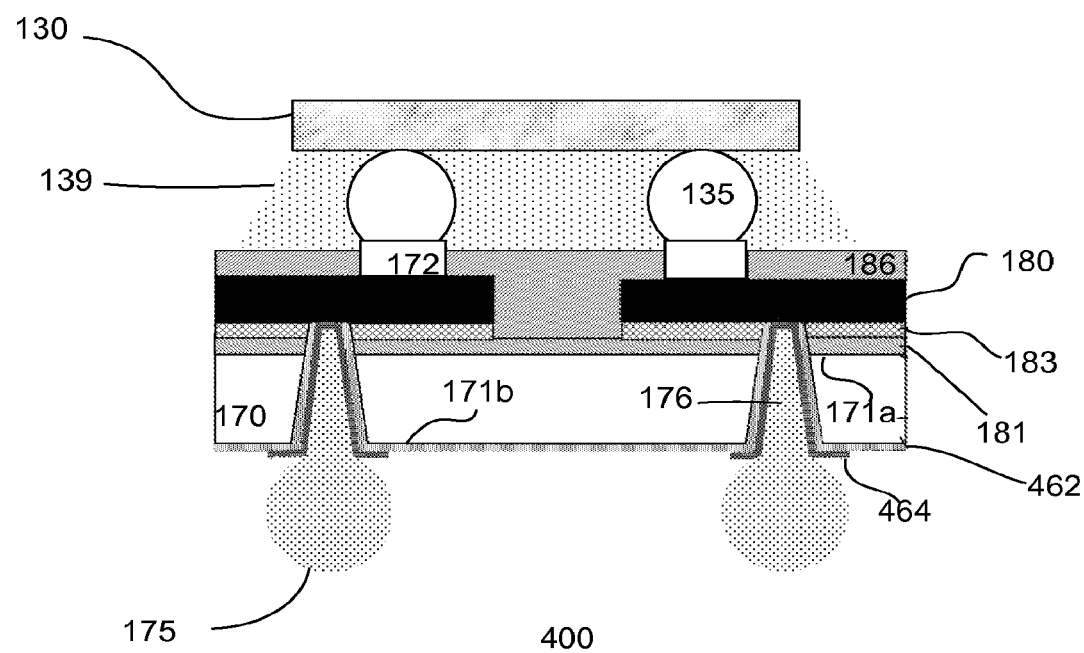

FIGS. 4*a-p* show an embodiment of a process 400 of forming a package. Referring to FIG. 4*a*, an interposer base layer 170 is provided. In one embodiment, the base comprises a material having the same or similar CTE as a die or dies of the package. For example, the base comprises silicon. Other types of material may be used to form the base.

The interposer base comprises first and second surfaces 171*a-b*. The first surface, for example, serves as the top surface and the second surface serves as the bottom surface. In one embodiment, a dielectric layer 181 is formed on the first surface of the base. The dielectric layer, for example, comprises silicon oxide. Other types of dielectric material, such as silicon nitride or polyimide may also be useful. The dielectric layer may be formed by, for example, chemical vapor deposition (CVD), lamination or spin coating. Other forming or deposition techniques may also be employed.

Above the dielectric layer is formed a seed layer 183. The seed layer, in one embodiment, comprises copper, other metals or alloys thereof. The seed layer may be formed by plating.

As shown in FIG. 4*b*, a photoresist layer 440 is formed on the seed layer. The photoresist layer is patterned to expose portions of the seed layer. The pattern of the exposed seed layer corresponds to the pattern of a redistribution layer. In one embodiment, as shown in FIG. 4*c*, a conductive layer is selectively formed over the exposed portions of the seed layer to form a redistribution layer 180. The conductive layer may comprise copper, aluminum, gold or other conductive metals or alloys thereof. To form the conductive layer, electroplating, evaporation or sputtering techniques may be employed. Other techniques can also be used to form the conductive or redistribution layer.

As shown in FIG. 4*d*, the remaining portions of the photoresist layer is removed after the conductive lines are formed to expose the seed layer 183 below. The exposed portions of the seed layer are removed. In one embodiment, the exposed portions of the seed layer are removed by etching. Other techniques can also be used.

In FIG. 4*e*, a passivation layer 186 is patterned over the redistribution layer 180 and dielectric layer 181. The passivation layer, in one embodiment, comprises a dielectric material, such as silicon nitride, silicon dioxide or polyimide. Providing other materials for the passivation layer is also useful. Various techniques, such as CVD, lamination or spin coating, may be employed to form the passivation layer. The areas of the redistribution layer 180 which are not covered by the patterned passivation would form interposer pad openings 171.

Referring to FIG. 4*f*, the pad openings are filled with a conductive material to form interposer or metallization pads 172. The pads, for example, comprise copper, nickel, gold, or alloys thereof. Other types of conductive materials may also be used. The openings may be filled by electroplating, evaporation or sputtering. Other techniques may also be used to fill the openings. For example, where the metallization pads are formed of nickel and gold, Electroless Nickel Immersion Gold (ENIG) process may be used. The opening should be completely filled with the conductive material. The conductive material, as shown, may have a top surface slightly above the passivation layer.

In FIG. 4*g*, a temporary substrate 483 is attached over the metallization pads and the passivation layer by using a bonding layer 479. The bonding layer, for example, comprises an adhesive layer. The adhesive layer provides temporary adhesion of the temporary substrate, enabling it to be subsequently removed. Other techniques for bonding the layers can also be used. The temporary substrate should comprise a material that is sufficiently stiff to support the assembly in subsequent processes. For example, the temporary substrate comprises copper, glass or a silicon plate. Other types of materials may also be useful. Thereafter, the base layer can be thinned to a desired thickness, for example, by grinding the bottom surface.

Referring to FIG. 4*h*, the second surface 171*b* of the base layer is etched to form vias 476. In one embodiment, a mask (not shown) is patterned onto the second surface of the base layer such that the mask exposes areas of the second surface where the vias are to be formed and covers the remaining areas. This is followed by deep reactive ion etching (DRIE) to form the vias. Other methods of forming the vias may also be useful.

The etch removes portions of the base layer, dielectric layer and seed layer, forming vias which exposes the redistribution layer. In one embodiment, the vias are formed with sloping sidewalls. Providing vias with non-sloping sidewalls may also be useful.

In one embodiment, as shown in FIG. 4*i*, a dielectric layer 462 is deposited on the base layer. The dielectric layer lines the second surface of the base layer as well as the sidewalls and bottom of the vias. The dielectric layer ensures electrical isolation of the vias, for example, when the base layer comprises silicon. The dielectric layer, for example, may comprise silicon oxide, silicon nitride or polyimide. Other types of dielectric materials which can provide electrical isolation are also useful. In one embodiment, the dielectric layer is deposited by CVD. Other deposition techniques can also be used.

Referring to FIG. 4j, portions of the dielectric layer lining the bottom of the vias are removed by, for example, etching to expose the redistribution layer.

In FIG. 4k, a conductive liner 464 is deposited on the base layer. The conductive liner lines the dielectric layer on the surface of the base layer and sidewalls of the vias as well as the exposed surface of the conductive lines of the redistribution layer at the bottom of the vias. In one embodiment, the conductive liner comprises a metallic material. For example, the conductive liner comprises titanium, titanium tungsten, titanium nitride, tantalum, copper, nickel, gold, combinations thereof or alloys thereof. Other types of conductive material may also be used. In one embodiment, the conductive liner is formed by sputtering. Other techniques for forming the conductive liner are also useful.

As shown in FIG. 4l, the conductive liner is removed, except at portions of the conductive liner lining the vias and at the periphery of the vias. The removal of the conductive liner can be achieved using a resist mask and dry etching. Other techniques for patterning the conductive liner may also be useful.

The process continues to form interposer contacts as well as filling the vias. Referring to FIG. 4m, flowable conductive material 475 is deposited at the opening of the vias. In one embodiment, the conductive material comprises solder. The solder may be deposited by a paste printing or a ball drop process or a combination of both. Other techniques for forming the flowable conductive material over the via openings are also useful.

As shown in FIG. 4n, the interposer is heated to cause the solder to reflow. This results in filling of the vias with the flowable conductive material 176 as well as forming the interposer contacts 175, such as bumps. After filling the vias and forming the contacts, the temporary substrate and the adhesive are removed, as shown in FIG. 4o. This results in the interposer pads being exposed.

The process continues by mounting a die 130 on the interposer to form a die assembly. The die, for example, comprises a flip chip with die bumps 135 on its active surface. The die bumps are electrically coupled to the die pads.

The space between the die and interposer may be filled with an underfill material 139. Various techniques can be used to provide the underfill in the space between the die and the interposer. For example, the underfill material can be needle-dispensed along the edges of the chip and drawn into the space between the chip and the interposer by capillary action and cured to form a permanent bond. Other techniques for applying the underfill material are also useful. Alternatively, no underfill is provided between the dies and interposer.

Processing may continue to form the package. For example, the die assembly may be mounted onto a package substrate and encapsulated with a mold compound, as shown in FIG. 1. The mold compound protects the die and contacts from the environment. Other materials are also useful. External package connections, for example, in the form of solder balls are provided at the bottom surface of the package substrate for connection to an external device such as a printed circuit board.

Figure 5A:
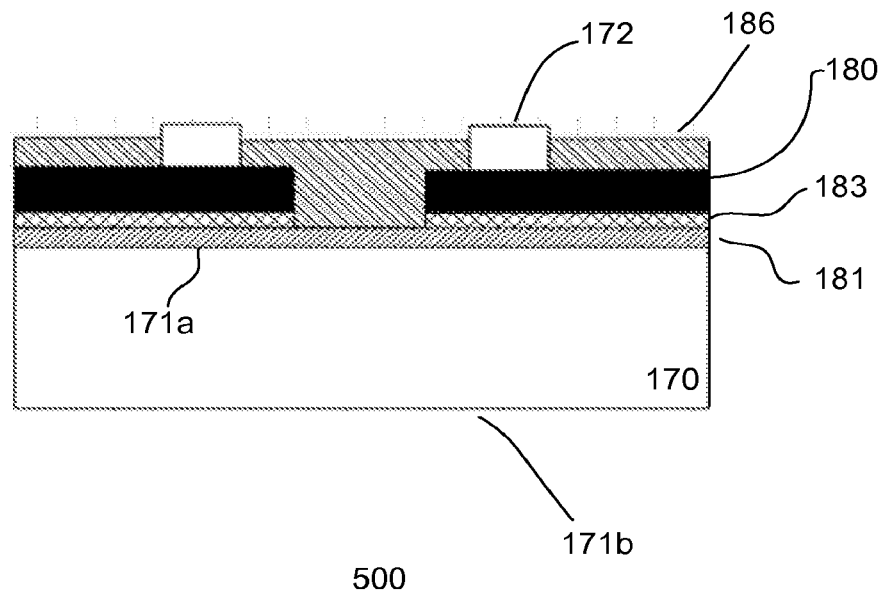
FIGS. 5a-e show another embodiment of a process for forming a package.

FIGS. 5a-e show another embodiment of a process 500 for forming a die assembly of a package. Referring to FIG. 5a, the process shows a partially formed interposer. The partially formed interposer, for example, is at the same stage of processing as that described in FIG. 4f. For example, the partially formed interposer includes an interposer base layer 170 having first and second surfaces 171a-b. A redistribution layer 180 coupled to interposer pads 172 is provided on the first surface isolated from the interposer base by a dielectric layer 181. A seed layer 183 may be provided below the redistribution layer. A passivation layer 186 is provided over the redistribution layer and isolates the interposer pads.

Figure 5B:
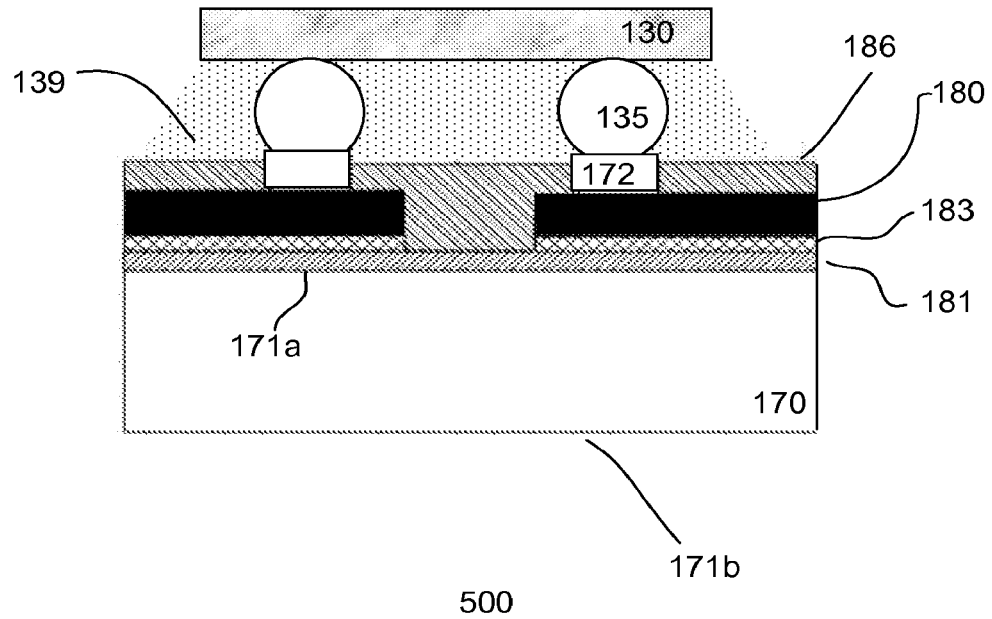

In FIG. 5b, a die 130 is mounted onto the interposer. The die, for example, comprises a flip chip. Other types of dies are also useful. The die includes die contacts 135 on an active surface thereof. The die contacts are electrically coupled to the interposer pads 172.

The space between the die and the interposer may be filled with an underfill material 139. Various techniques can be used to provide the underfill in the space between the die and interposer. For example, the underfill material can be needle-dispensed along the edges of the chip and drawn into the space between the chip and the interposer by capillary action and cured to form a permanent bond. Other techniques for applying the underfill material are also useful. Alternatively, no underfill is provided between the dies and interposer.

Figure 5C:
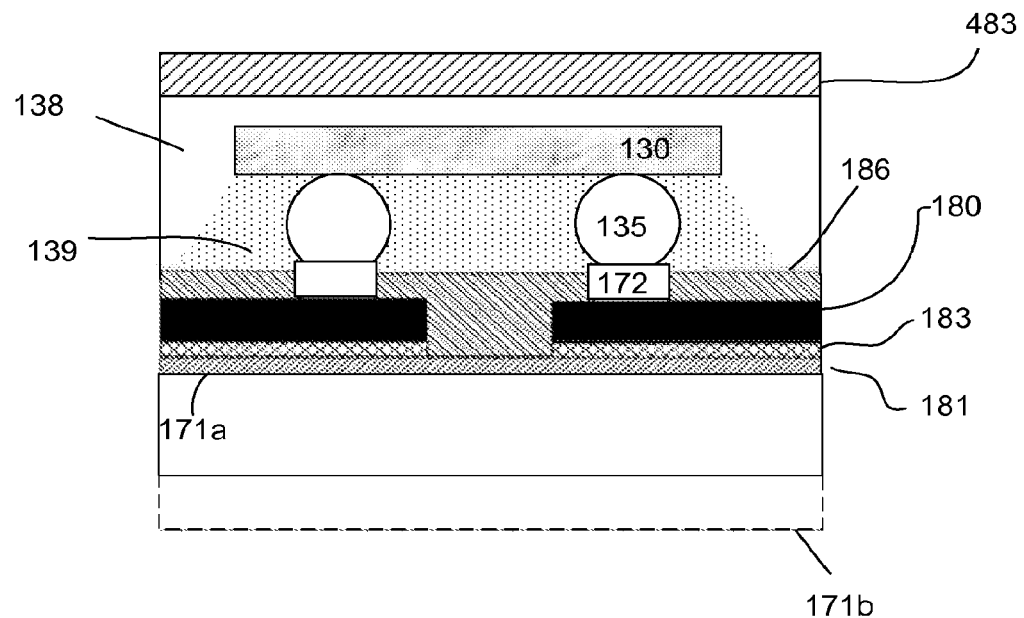

As shown in FIG. 5c, a temporary substrate 483 is attached over the die. The temporary substrate should comprise a material that is sufficiently stiff to support the assembly in subsequent processes. For example, the temporary substrate comprises copper, glass or a silicon plate. Other types of materials may also be useful. In one embodiment, the temporary substrate is attached over the chip using a mold compound 138. For example, the temporary substrate can be disposed in a mold while the mold compound is injected to encapsulate the die first surface of the interposer. Other techniques for attaching the interposer over the die may also be useful. After attaching the temporary substrate, the interposer base layer can be thinned to a desired thickness, for example, by grinding the second surface.

Figure 5D:
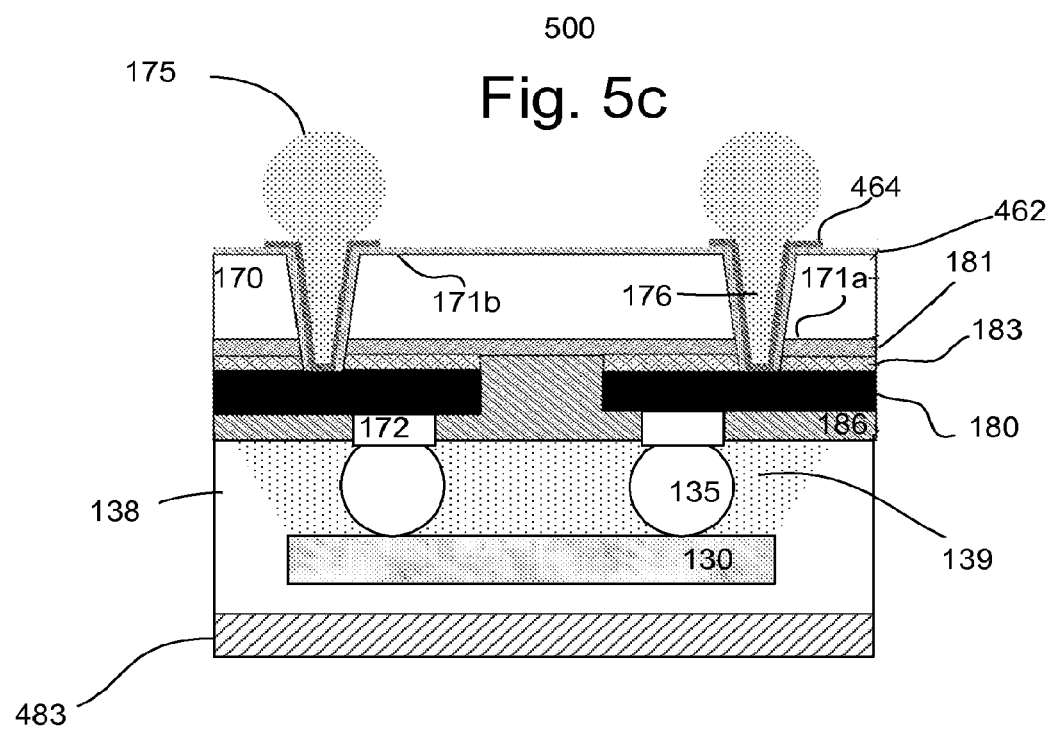

Referring to FIG. 5d, the process continues by forming interposer contacts 175 on the second surface and vias 176 through the interposer base 170. In one embodiment, the vias are filled by reflowing the conductive material of the interposer contacts, such as solder. The process of forming the interposer contacts and vias, in one embodiment, is similar to that described in FIGS. 4h-n.

For example, the interposer base is etched to form vias to expose portions of the redistribution layer 180. The second surface 171b of the interposer base and sidewalls of the vias are lined with a dielectric liner 462. The bottom, sidewalls and periphery of the vias on the second surface are coated with a metallic layer 464. Solder is then deposited by, for example, a paste printing or a ball drop process or a combination of both over the via openings and reflowed to form the interposer contacts 175 and filling the vias 176 with solder.

Figure 5E:
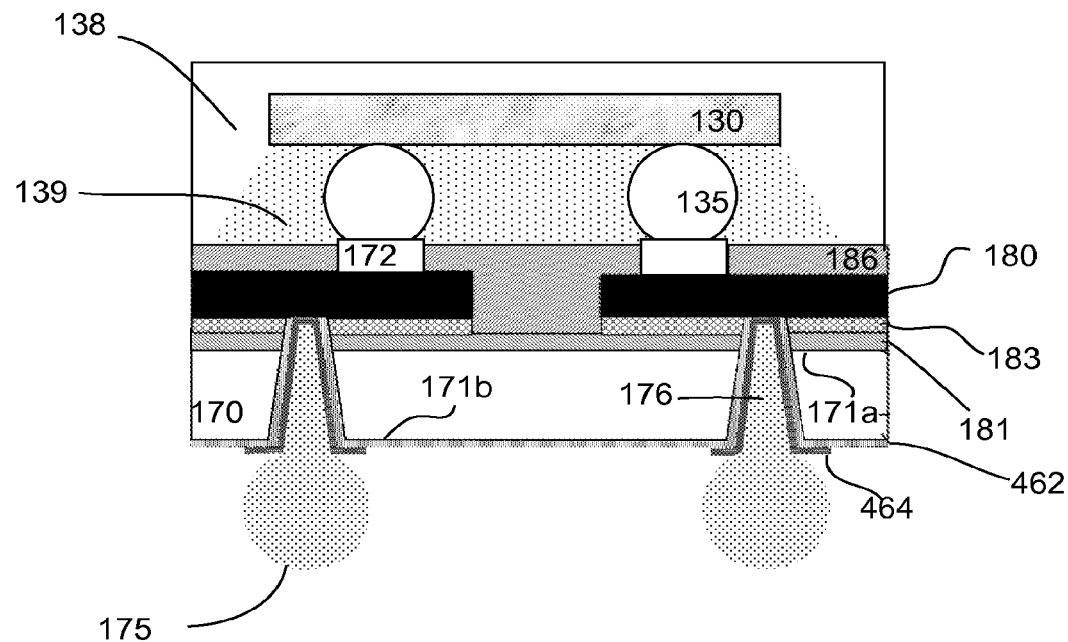

In FIG. 5e, the temporary substrate is removed from the die assembly. For example the temporary substrate is removed from the surface of the mold compound 138 encapsulating the die.

Processing may continue to form the package. For example, the die assembly may be mounted onto a package substrate and encapsulated with a mold compound, as shown in FIG. 2. The mold compound protects the die and contacts from the environment. Other materials are also useful. External package connections, for example, in the form of solder balls are provided at the bottom surface of the package substrate for connection to an external device such as a printed circuit board.

Figure 6A:
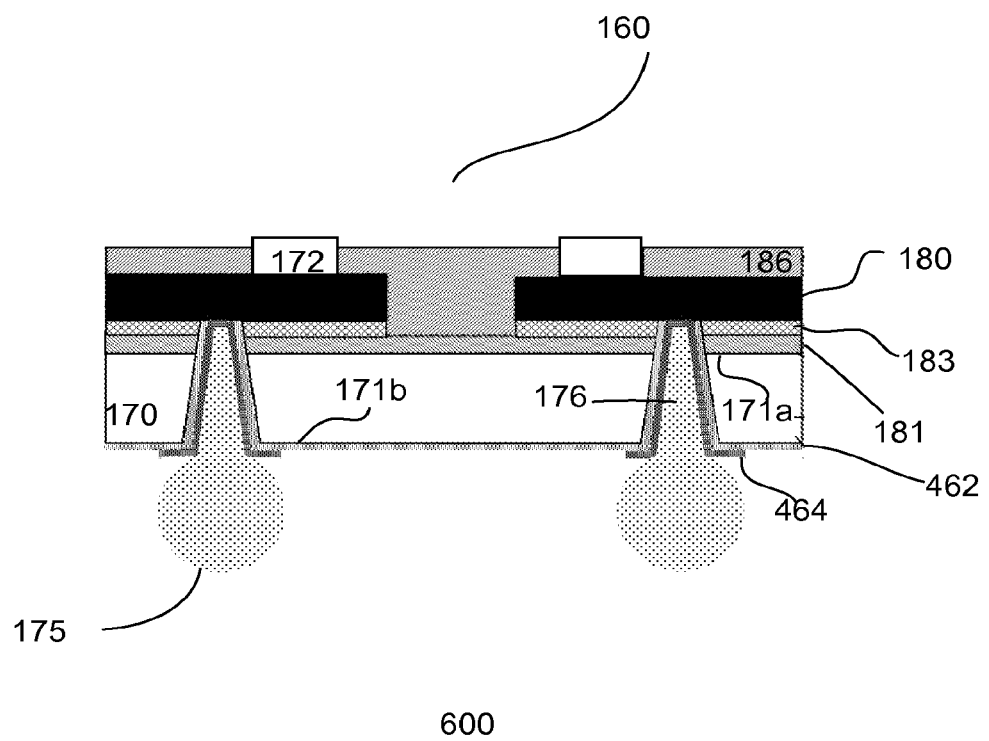
FIGS. 6a-b show yet another embodiment of a process for forming a package.
Figure 6B:
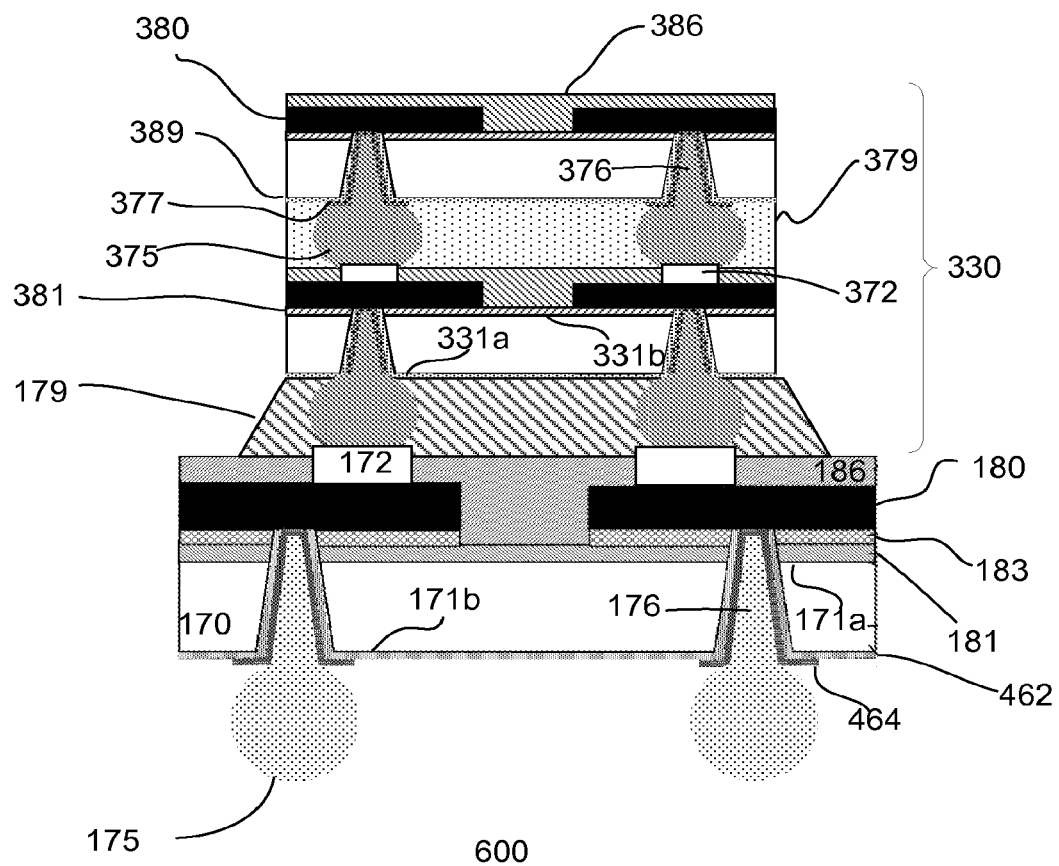

FIGS. 6a-b show another embodiment of a process 600 for forming a die assembly of a package. Referring to FIG. 6a, the process shows an interposer 160. In one embodiment, the interposer is formed by the process described in FIGS. 4n-o.

The interposer includes an interposer base layer 170 having first and second surfaces 171a-b. A redistribution layer 180 coupled to interposer pads 172 is provided on the first surface isolated from the interposer base by a dielectric layer 181. A seed layer 183 may be provided below the redistribution layer. A passivation layer 186 is provided over the redistribution layer and isolates the interposer pads.

Interposer contacts 175 are formed on the second surface 171b. The contacts are coupled to the redistribution layer by vias 176. The second surface 171b of the interposer base and sidewalls of the vias are lined with a dielectric liner 462. The bottom, sidewalls and periphery of the vias on the second surface are coated with a metallic layer 464. The contacts are formed from a conductive material. Forming the contacts, in one embodiment, also fills the vias by reflowing the conductive material, such as solder, used to form the contacts.

As shown in FIG. 6b, the process continues by mounting a die stack 330 onto the interposer 160. The die stack comprises a plurality of dies. The dies forming the die stack may comprise interposers made from active silicon wafers or chips, dies with through silicon interconnects, flip chips or combinations thereof. To interconnect the dies, a die redistribution layer 380 coupled to die pads 372 is provided on an inactive surface 331b of a die. To isolate the die redistribution layer from the die, a die dielectric layer 381 may be provided between the inactive surface of the die and die redistribution layer. A seed layer (not shown) may be disposed beneath the die redistribution layer 380. It is understood that the die on the top of the die stack need not have a redistribution layer.

Die contacts 375 on an active surface 331a are coupled to the die pads by die vias 376 and the die redistribution layer. A die passivation layer 186 is provided over the die redistribution layer and isolates the die interposer pads.

In one embodiment, the inactive surface 331b of the die and sidewalls of the die vias are lined with a die dielectric liner 389. The bottom, sidewalls and periphery of the vias on the inactive die surface are coated with a metallic layer 377. The die contacts are formed from conductive material. Forming the die contacts, in one embodiment, also fills the die vias by reflowing conductive material, such as solder, used to form the die contacts.

Processing may continue to form the package. For example, the die assembly may be mounted onto a package substrate and encapsulated with a mold compound, as shown in FIG. 3. The mold compound protects the die and contacts from the environment. Other materials are also useful. External package connections, for example, in the form of solder balls are provided at the bottom surface of the package substrate for connection to an external device such as a printed circuit board.

It will be appreciated that, although only a single flip chip is described, stacked chips with through silicon interconnects are also applicable in place of the single flip chip. It will also be appreciated that while the drawings show the interposer 10 in a single unit format, the interposer 10 can also be in strip format or wafer format for enabling multiple flip chips to be mounted in parallel.

The invention may be embodied in other specific forms without departing from the spirit or essential characteristics thereof. The foregoing embodiments, therefore, are to be considered in all respects illustrative rather than limiting the invention described herein.

What is claimed is:

1. A device package comprising:
    an interposer which includes an interposer base having first and second surfaces;
    a redistribution layer disposed on a first surface of the interposer base;
    interposer pads coupled to the redistribution layer;
    interposer vias through the interposer base in communication with the redistribution layer;
    interposer contacts coupled to the interposer pads via the redistribution layer, wherein an interposer contact includes a via portion disposed in the interposer via and a surface portion on the second surface of the interposer base, wherein the via portion and surface portion comprise a single material, and the interposer contact is a single unitary contact of which no seam or interface exist between the via portion and the surface portion;
    a die comprising die contacts, the die contacts coupled to the interposer pads; and
    a package substrate having package pads on a first surface, wherein the interposer contacts are coupled to the package pads.

2. The device package of claim 1 wherein the single material comprises a reflowable conductive material.

3. The device package of claim 1 wherein the reflowable material comprises solder.

4. The device package of claim 1 wherein the base comprises a material having a coefficient of thermal expansion at least similar to that of the die.

5. The device package of claim 1 wherein the base comprises silicon.

6. The device package of claim 1 wherein the die comprises a flip chip.

7. The device package of claim 1 wherein a die stack comprising a plurality of dies serving as active interposers are coupled to the interposer.

8. The device package of claim 1 further comprises a cap encapsulating the die, interposer and the first surface of the package substrate.

9. A device package comprising:
    an interposer base having first and second surfaces;
    a redistribution layer disposed on a first surface of the interposer base;
    at least one interposer pad disposed over and coupled to the redistribution layer;
    at least one interposer via through the interposer base in communication with the redistribution layer;
    an integrated interposer contact coupled to the interposer pad via the redistribution layer, the integrated interposer contact having a via portion disposed in the interposer via and a surface portion on the second surface of the interposer base, wherein the via portion comprises reflowable conductive material of the surface portion;
    a die comprising at least one die contact, the die contact is coupled to the interposer pad; and
    a package substrate having at least one package pad on a first surface, wherein the interposer contact are coupled to the package pad.

10. The device package of claim 9 wherein the reflowable conductive material comprises solder.

11. The device package of claim 9 wherein the base comprises a material having a coefficient of thermal expansion (CTE) at least similar to that of the die.

12. The device package of claim 9 wherein the interposer base comprises silicon.

13. The device package of claim 9 comprises a first insulating layer disposed between the first surface of the interposer base and the redistribution layer.

14. The device package of claim 13 comprises a second insulating layer lining sidewalls of the via and on the second surface of the interposer base.

15. The device package of claim 9 wherein a die stack comprising a plurality of dies serving as active interposers are coupled to the interposer.

16. The device package of claim 9 further comprises a cap encapsulating the die, interposer and the first surface of the package substrate.

17. The device package of claim 9 wherein the die comprises a flip chip.

18. The device package of claim 9 wherein the die comprises a die cap which encapsulates the die and top surface of the interposer.

19. The device package of claim 1 wherein the die comprises a die cap which encapsulates the die and a top surface of the interposer.

20. The device package of claim 1 wherein the interposer comprises an inactive interposer.

* * * * *